(12) United States Patent
Guo et al.

(10) Patent No.: US 12,332,294 B2
(45) Date of Patent: Jun. 17, 2025

(54) SHIELDING LAYER DETECTION CIRCUIT AND TRANSMISSION SYSTEM (71) Applicant: Guangdong Rifeng Cable Co., Ltd., Zhongshan (CN)

(72) Inventors: Lanwang Guo, Zhongshan (CN); Daijun Jiang, Zhongshan (CN)

(73) Assignee: Guangdong Rifeng Cable Co., Ltd., Zhongshan (CN)

( * ) Notice: Subject to any disclaimer, the term of this patent is extended or adjusted under 35 U.S.C. 154(b) by 248 days.

(21) Appl. No.: 18/320,950

(22) Filed: May 19, 2023

(65) Prior Publication Data

US 2024/0264216 A1 Aug. 8, 2024

(30) Foreign Application Priority Data

Feb. 6, 2023 (CN) .......................... 202310095268.7

(51) Int. Cl.
*G01R 31/12* (2020.01)
*H01B 9/02* (2006.01)

(52) U.S. Cl.
CPC ........... *G01R 31/1272* (2013.01); *H01B 9/02* (2013.01)

(58) Field of Classification Search
CPC ...... G01R 31/50–59; G01R 31/08–086; G01R 31/1272; G01R 15/04; H01B 9/02; H02H 7/22; H02H 1/0007
See application file for complete search history.

(56) References Cited

U.S. PATENT DOCUMENTS

| | | | | |
|---|---|---|---|---|
| 6,459,271 B1* | 10/2002 | Vokey | ................... | G01R 31/58 |
| | | | | 324/522 |
| 2010/0020452 A1* | 1/2010 | Gandolfi | .................. | H02H 3/16 |
| | | | | 361/42 |
| 2019/0115748 A1* | 4/2019 | Li | ........................ | H01R 13/713 |

FOREIGN PATENT DOCUMENTS

| CN | 104808880 A | 7/2015 |
|---|---|---|
| CN | 105050372 A | 11/2015 |
| CN | 110299225 A | 10/2019 |

* cited by examiner

*Primary Examiner* — Lee E Rodak
*Assistant Examiner* — Demetrius R Pretlow (57) ABSTRACT The present invention discloses a shielding layer detection circuit and a transmission system. The shielding layer detection circuit includes a first resistive voltage division assembly, a second resistive voltage division assembly, a switch module, and a control module. The first resistive voltage division assembly is connected to a conductive shielding layer group to detect an electric leakage signal; the second resistive voltage division assembly has a first detection terminal connected to one terminal of the conductive shielding layer group and a second detection terminal connected to the other terminal of the conductive shielding layer group to detect a breakage signal; the switch module is connected to a power supply bus bar group to switch a transmission line connection/disconnection state of the power supply bus bar group.

10 Claims, 4 Drawing Sheets

SHIELDING LAYER DETECTION CIRCUIT AND TRANSMISSION SYSTEM

CROSS-REFERENCE TO RELATED APPLICATIONS

The application claims priority to Chinese patent application No. 202310095268.7, filed on Feb. 6, 2023, the entire contents of which are incorporated herein by reference.

TECHNICAL FIELD

The present invention relates to the technical field of cable devices, in particular to a shielding layer detection circuit and a transmission system.

BACKGROUND

In general, an existing power supply transmission line includes a power supply bus bar and a conductive shielding layer sheathed on the power supply bus bar. The conductive shielding layer needs to be detected using a shielding layer detection circuit, to determine whether there is a short circuit between the power supply bus bar and the conductive shielding layer, and whether there is a breakage on the conductive shielding layer. There are a plurality of implementations for circuit structures of an electric leakage detection module and a breakage detection module of the shielding layer detection circuit. A switching transistor or diode made of a semiconductor material is generally used as a sampling element. For example, different pins of the switching transistor are connected to two terminals of the conductive shielding layer, a voltage difference formed by the breakage of the conductive shielding layer drives the switching transistor to be turned on so as to form a breakage signal, and the conduction of the power supply bus bar is timely cut off according to the breakage signal. However, the switching transistor or diode made of the semiconductor material may be aged to cause a detected fault, has a shorter maintenance cycle, and requires labor costs.

SUMMARY

The present invention aims to at least solve one of the technical problems existing in the prior art. In this regard, the present invention provides a shielding layer detection circuit and a transmission system, which improves the durability of use, achieves the accurate detection, and reduces the maintenance cost.

A shielding layer detection circuit according to an embodiment of a first aspect of the present invention is applied to a power supply bus bar group. The power supply bus bar group is sheathed with a conductive shielding layer group. The shielding layer detection circuit includes: a first resistive voltage division assembly, connected to the conductive shielding layer group to detect an electric leakage signal, where the electric leakage signal is used to represent that a short circuit occurs between the power supply bus bar group and the conductive shielding layer group: a second resistive voltage division assembly, including a first detection terminal and a second detection terminal, where the second resistive voltage division assembly has the first detection terminal connected to one terminal of the conductive shielding layer group and the second detection terminal connected to the other terminal of the conductive shielding layer group to detect a breakage signal, where the breakage signal is used to represent that the conductive shielding layer group is broken; a switch module, connected to the power supply bus bar group to switch a transmission line connection/disconnection state of the power supply bus bar group; and a control module, connected to an output terminal of the first resistive voltage division assembly, an output terminal of the second resistive voltage division assembly, and a controlled terminal of the switch module, respectively, to control the switch module to be turned off when receiving either of the electric leakage signal and the breakage signal.

A shielding layer detection circuit according to an embodiment of the present invention has at least the following beneficial effects:

According to the shielding layer detection circuit in the present invention, voltage division processing is performed by using the first resistive voltage division assembly to detect and form the electric leakage signal, and voltage division processing is performed by using the second resistive voltage division assembly to detect and form the breakage signal; and the control module controls the switch module to be turned off when receiving either of the electric leakage signal and the breakage signal. Resistor elements have better durability of use and are not prone to aging and damage, so that good detection accuracy can be always maintained; and frequent maintenance is not required in a short term, thereby reducing the maintenance cost.

According to some embodiments of the present invention, the shielding layer detection circuit includes a first resistor element R5, a second resistor element R6, a third resistor element R7, a fourth resistor element R8, and a switching transistor Q2, where the first resistor element R5 and the fourth resistor element R8 constitute at least a part of the first resistive voltage division assembly, the first resistor element R5, the second resistor element R6, the third resistor element R7, the fourth resistor element R8, and the switching transistor Q2 constitute at least a part of the second resistive voltage division assembly, the first resistor element R5 has one terminal electrically connected to an input electrode of the switching transistor Q2 and one phase of the power supply bus bar group, respectively, and the other terminal electrically connected to one terminal of the second resistor element R6, one terminal of the third resistor element R7, and one terminal of the conductive shielding layer group, respectively, the other terminal of the second resistor element R6 is electrically connected to a controlled electrode of the switching transistor Q2, the other terminal of the third resistor element R7 is electrically connected to an output terminal of the switching transistor Q2, the other terminal of the conductive shielding layer group, one terminal of the fourth resistor element R8, and the control module, respectively, and the other terminal of the fourth resistor element R8 is electrically connected to the other phase of the power supply bus bar group.

According to some embodiments of the present invention, the shielding layer detection circuit further includes a unidirectional conductive element, where the unidirectional conductive element has a conductive terminal electrically connected to the other terminal of the fourth resistor element R8 and a cut-off terminal electrically connected to the other phase of the power supply bus bar group, and the unidirectional conductive element allows a current to flow from the conductive terminal to the cut-off terminal so as to prevent the current from flowing from the cut-off terminal to the conductive terminal.

According to some embodiments of the present invention, the shielding layer detection circuit further includes a test switch, where the test switch is connected in parallel to the first resistor element R5 and is driven to switch an on/off state.

According to some embodiments of the present invention, the first resistive voltage division assembly includes a first resistor element R5 and a fourth resistor element R8, the first resistor element R5 has one terminal electrically connected to one phase of the power supply bus bar group and the other terminal electrically connected to one terminal of the fourth resistor element R8, the control module, and the conductive shielding layer group, and the other terminal of the fourth resistor element R8 is electrically connected to the other phase of the power supply bus bar group.

According to some embodiments of the present invention, the second resistive voltage division assembly includes a first resistor element R5, a second resistor element R6, a third resistor element R7, a fourth resistor element R8, and a switching transistor Q2, the first resistor element R5 has one terminal electrically connected to an input electrode of the switching transistor Q2 and one phase of the power supply bus bar group, respectively, and the other terminal electrically connected to one terminal of the second resistor element R6, one terminal of the third resistor element R7, and one terminal of the conductive shielding layer group, respectively, the other terminal of the second resistor element R6 is electrically connected to a controlled electrode of the switching transistor Q2, the other terminal of the third resistor element R7 is electrically connected to an output electrode of the switching transistor Q2, the other terminal of the conductive shielding layer group, one terminal of the fourth resistor element R8, and the control module, respectively, and the other terminal of the fourth resistor element R8 is electrically connected to the other phase of the power supply bus bar group.

According to some embodiments of the present invention, the switch module includes a relay unit, the relay unit includes a relay switch and a relay coil capable of driving the relay switch to be turned on/off, the relay switch is connected to the power supply bus bar group to switch the transmission line connection/disconnection state of the power supply bus bar group, the control module includes a switching transistor Q1, the relay coil is connected to the switching transistor Q1 to constitute at least a part of a driving power supply circuit, the driving power supply circuit is connected to the power supply bus bar group, and a controlled electrode of the switching transistor Q1 is connected to the output terminal of the first resistive voltage division assembly and the output terminal of the second resistive voltage division assembly, respectively.

According to some embodiments of the present invention, the shielding layer detection circuit further includes an indicator light group electrically connected to the power supply bus bar group.

A transmission system according to an embodiment of a second aspect of the present invention includes a shielding layer detection circuit and a power supply bus bar group. The power supply bus bar group is sheathed with a conductive shielding layer group. The shielding layer detection circuit includes: a first resistive voltage division assembly, connected to the conductive shielding layer group to detect an electric leakage signal, where the electric leakage signal is used to represent that a short circuit occurs between the power supply bus bar group and the conductive shielding layer group; a second resistive voltage division assembly, including a first detection terminal and a second detection terminal, where the second resistive voltage division assembly has the first detection terminal connected to one terminal of the conductive shielding layer group and the second detection terminal connected to the other terminal of the conductive shielding layer group to detect a breakage signal, where the breakage signal is used to represent that the conductive shielding layer group is broken; a switch module, connected to the power supply bus bar group to switch a transmission line connection/disconnection state of the power supply bus bar group; and a control module, connected to an output terminal of the first resistive voltage division assembly, an output terminal of the second resistive voltage division assembly, and a controlled terminal of the switch module, respectively, to control the switch module to be turned off when receiving either of the electric leakage signal and the breakage signal.

A transmission system according to an embodiment of the present invention has at least the following beneficial effects:

According to the transmission system in the present invention, electrical energy is transmitted by using the power supply bus bar group; the conductive shielding layer group is configured to detect a power transmission safety state of the power supply bus bar group; when the conductive shielding layer group is broken, voltage division processing is performed by using the second resistive voltage division assembly to detect and form the breakage signal, and when the power supply bus bar group has a fault, the short circuit occurs between the power supply bus bar group and the conductive shielding layer group, and voltage division processing is performed by using the first resistive voltage division assembly to detect and form the electric leakage signal; and the control module controls the switch module to be turned off when receiving either of the electric leakage signal and the breakage signal. Resistor elements have better durability of use and are not prone to aging and damage, so that good detection accuracy can be always maintained; and frequent maintenance is not required in a short term, thereby reducing the maintenance cost.

According to some embodiments of the present invention, the power supply bus bar group includes a first bus bar and a second bus bar, the conductive shielding layer group includes a first shielding layer and a second shielding layer that are conductive, the first shielding layer is sheathed on the first bus bar, the second shielding layer is sheathed on the second bus bar, the switch module is connected to the first bus bar and the second bus bar, respectively, to switch transmission line connection/disconnection states of the first bus bar and the second bus bar, the first resistive voltage division assembly is connected to the first shielding layer or the second shielding layer, the second resistive voltage division assembly has the first detection terminal connected to one terminal of the first shielding layer and the second detection terminal connected to one terminal of the second shielding layer, and the other terminal of the first shielding layer is connected to the other terminal of the second shielding layer.

The additional aspects and advantages of the present invention will be partially given in the description below, and part of them will become apparent from the description below or will be learned from the practice of the present invention.

BRIEF DESCRIPTION OF DRAWINGS

The above and/or additional aspects and advantages of the present invention will become apparent and easily understood from the description of the embodiments in combination with the accompanying drawings below, in which.

Reference signs; conductive shielding layer group;

first resistive voltage division assembly 100; second resistive voltage division assembly 200; switch module 300; relay switch 310; relay coil 320; control module 400; indicator light group 500; unidirectional conductive element 610; test switch 620; first bus bar 710; first current carrying core 711; first insulation layer 712; second bus bar 720; second current carrying core 721; second insulation layer 722; first shielding layer 730; second shielding layer 740; sheath layer 750; non-woven fabric layer 810; wire body 820; conductive layer assembly 830; first conductive layer 831; second conductive layer 832; power supply bus bar group 910; and conductive shielding layer group 920.

DETAILED DESCRIPTION OF THE EMBODIMENTS

The embodiments of the present invention are described in detail below. The examples of the embodiments are shown in the accompanying drawings, in which the same or similar reference numbers represent the same or similar elements or elements with the same or similar functions throughout. The embodiments described below with reference to the accompanying drawings are exemplary and only intended to explain the present invention, and cannot be construed as a limitation to the present invention.

In the description of the present invention, it should be understood that the description of orientations is involved, for example, the orientational or positional relationships indicated by the terms "upper", "lower". "front", "back". "left", "right", "vertical". "horizontal", "top", "bottom", "inside". "outside", etc. are based on the orientational or positional relationships shown in the accompanying drawings, only for the convenience of describing the present invention and simplifying the description rather than indicating or implying that the device or element referred to must have a specific orientation or be constructed and operated in a specific orientation, and therefore should not be construed as a limitation to the present invention.

In the description of the present invention, "several" refers to one or more, "a plurality of" refers to two or more, "greater than", "less than", "exceed", etc. are understood as excluding itself, and "above", "below", "within", etc. are understood as including itself. If there is a description of "first" and "second", they are only used for distinguishing technical features and should not be understood as indicating or implying relative importance, implicitly indicating the number of technical features indicated, or implicitly indicating the order of technical features indicated.

In the description of the present invention, it should be noted that the terms "install". "connected", and "connection" should be understood in a broad sense, unless otherwise expressly specified and limited; for example, the "connection" may be fixed connection, detachable connection, or integrated connection; the "connection" may also be mechanical connection or electrical connection; and the "connected" may be directly connected, indirectly connected via an intermediate medium, or communication between interiors of two elements. Those of ordinary skill in the art may understand the specific meanings of the above terms in the present invention according to the specific circumstances.

As shown in FIGS. 1-4, a shielding layer detection circuit according to an embodiment of a first aspect of the present invention is applied to a power supply bus bar group 910. The power supply bus bar group 910 is sheathed with a conductive shielding layer group 920. The shielding layer detection circuit includes a first resistive voltage division assembly 100, a second resistive voltage division assembly 200, a switch module 300, and a control module 400. The first resistive voltage division assembly 100 is connected to the conductive shielding layer group 920 to detect an electric leakage signal, where the electric leakage signal is used to represent that a short circuit occurs between the power supply bus bar group 910 and the conductive shielding layer group 920. The second resistive voltage division assembly 200 includes a first detection terminal and a second detection terminal, where the second resistive voltage division assembly 200 has the first detection terminal connected to one terminal of the conductive shielding layer group 920 and the second detection terminal connected to the other terminal of the conductive shielding layer group 920 to detect a breakage signal, where the breakage signal is used to represent that the conductive shielding layer group 920 is broken. The switch module 300 is connected to the power supply bus bar group 910 to switch a transmission line connection/disconnection state of the power supply bus bar group 910. The control module 400 is connected to an output terminal of the first resistive voltage division assembly 100, an output terminal of the second resistive voltage division assembly 200, and a controlled terminal of the switch module 300, respectively, to control the switch module 300 to be turned off when receiving either of the electric leakage signal and the breakage signal.

Figure 1:
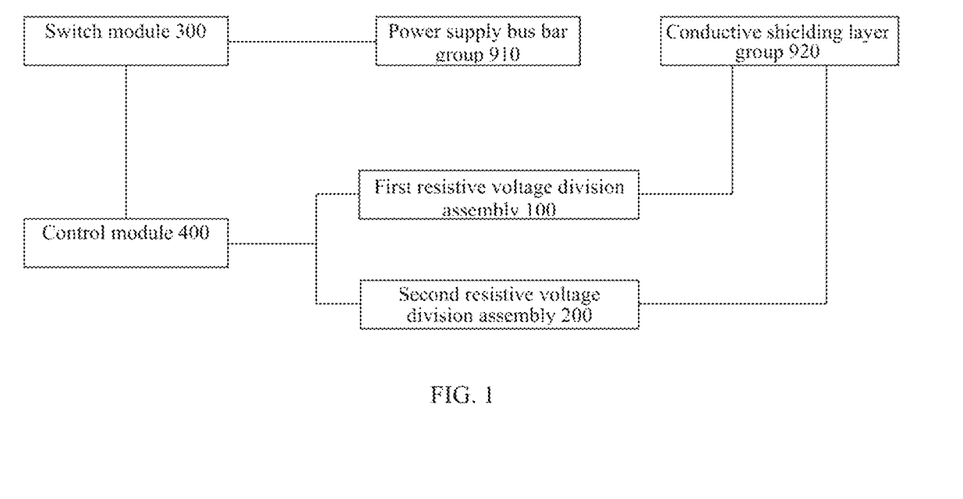
FIG. 1 is a principle structure block diagram of an embodiment of a shielding layer detection circuit according to the present invention.
Figure 2:
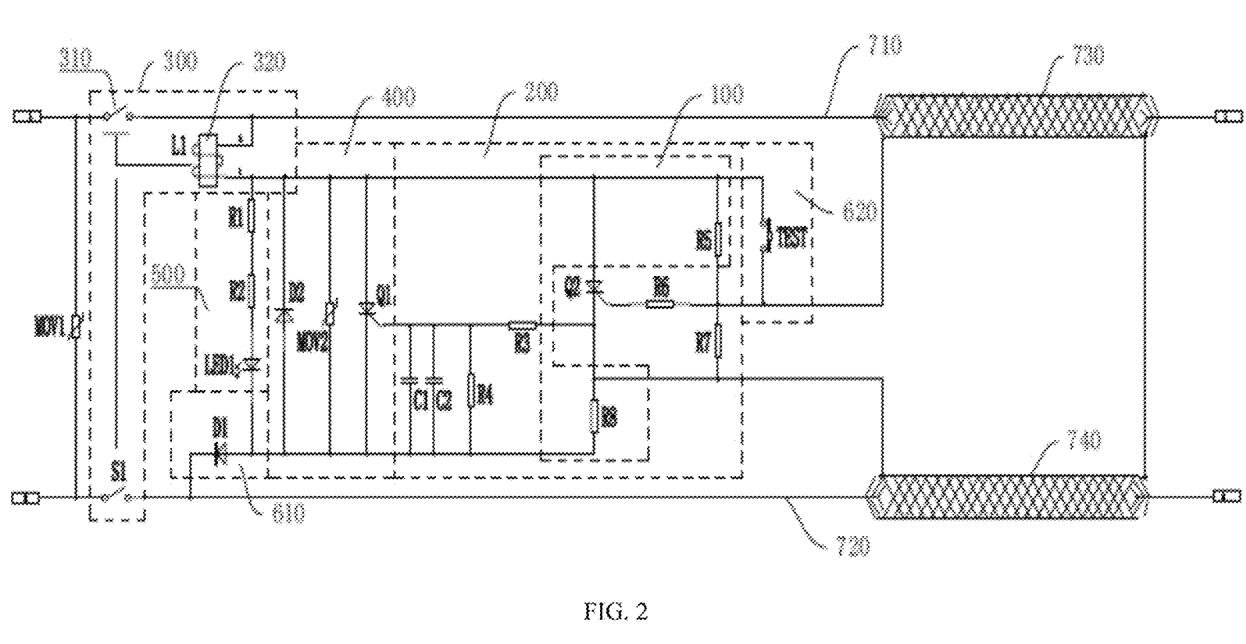
FIG. 2 is a schematic circuit diagram of an embodiment of a shielding layer detection circuit according to the present invention.
Figure 3:
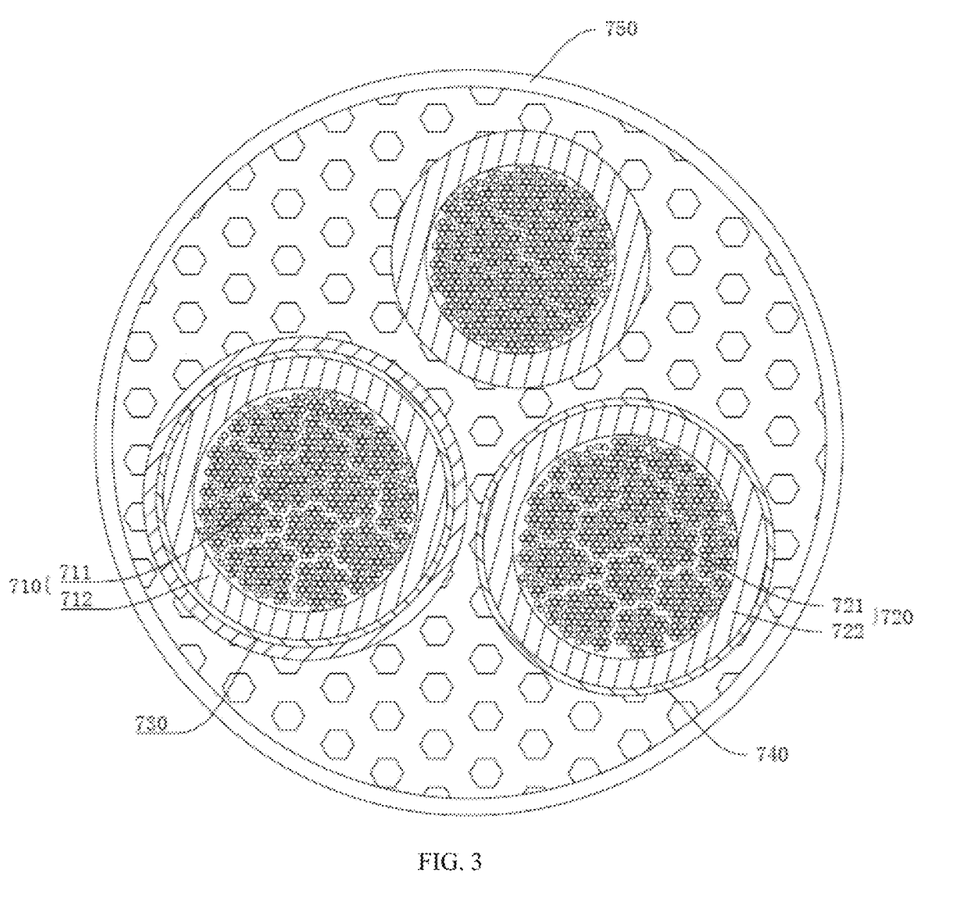
FIG. 3 is a schematic diagram of a sectional structure of a transmission line.

It should be noted that as shown in FIGS. 2 and 3, a transmission line has a length, the power supply bus bar group 910 and the conductive shielding layer group 920 are included in the transmission line, and both the power supply bus bar group 910 and the conductive shielding layer group 920 are arranged along a length direction of the transmission line.

The power supply bus bar group 910 may be configured to transmit an alternating current. The power supply bus bar group 910 generally includes a first bus bar 710 and a second bus bar 720. The conductive shielding layer group 920 includes a first shielding layer 730 and a second shielding layer 740 that are conductive. Both the first shielding layer 730 and the second shielding layer 740 may be in a tubular shape. The first shielding layer 730 is sheathed on the first bus bar 710, and the second shielding layer 740 is sheathed on the second bus bar 720.

The switch module 300 is connected to the first bus bar 710 and the second bus bar 720, respectively, to switch transmission line connection/disconnection states of the first bus bar 710 and the second bus bar 720. Specifically, the first bus bar 710 may be connected to an L phase of an alternating current power supply, and the second bus bar 720 may be connected to an N phase of the alternating current power supply.

It should be noted that the switch module 300 may be a self-locking switch, which may be driven to be turned off when either of the electric leakage signal and the breakage signal is received, and remains in a turn-off state without an external force.

According to the shielding layer detection circuit in the present invention, voltage division processing is performed by using the first resistive voltage division assembly 100 to detect and form the electric leakage signal, and voltage division processing is performed by using the second resistive voltage division assembly 200 to detect and form the breakage signal; and the control module 400 controls the switch module 300 to be turned off when receiving either of the electric leakage signal and the breakage signal. Resistor elements have better durability of use and are not prone to aging and damage, so that good detection accuracy can be always maintained; and frequent maintenance is not required in a short term, thereby reducing the maintenance cost.

According to some embodiments of the present invention, the first resistive voltage division assembly 100 may include a first resistor element R5 and a fourth resistor element R8, the first resistor element R5 has one terminal electrically connected to one phase of the power supply bus bar group 910 and the other terminal electrically connected to one terminal of the fourth resistor element R8, the control module 400, and the conductive shielding layer group 920, and the other terminal of the fourth resistor element R8 is electrically connected to the other phase of the power supply bus bar group 910.

It should be noted that the first resistor element R5 has a larger resistance; one terminal of the first resistor element R5 is connected to the first bus bar 710, and the other terminal of the fourth resistor element R8 is connected to the second bus bar 720; in a normal state, there is no short circuit between the first bus bar 710 and the first shielding layer 730 or between the second bus bar 720 and the second shielding layer 740; a terminal voltage of a connection point between the first resistor element R5 and the fourth resistor element R8 is low enough to trigger the formation of the electric leakage signal; when the short circuit occurs between the first bus bar 710 and the first shielding layer 730 or between the second bus bar 720 and the second shielding layer 740, a voltage of the conductive shielding layer group 920 increases to pull up the terminal voltage of the connection point between the first resistor element R5 and the fourth resistor element R8, to trigger the formation of the electric leakage signal; and the control module 400 controls the switch module 300 to be turned off after receiving the electric leakage signal, thereby ensuring the power transmission safety of the power supply bus bar group 910.

According to some embodiments of the present invention, the second resistive voltage division assembly 200 includes a first resistor element R5, a second resistor element R6, a third resistor element R7, a fourth resistor element R8, and a switching transistor Q2, the first resistor element R5 has one terminal electrically connected to an input electrode of the switching transistor Q2 and one phase of the power supply bus bar group 910, respectively, and the other terminal electrically connected to one terminal of the second resistor element R6, one terminal of the third resistor element R7, and one terminal of the conductive shielding layer group 920, respectively, the other terminal of the second resistor element R6 is electrically connected to a controlled electrode of the switching transistor Q2, the other terminal of the third resistor element R7 is electrically connected to an output electrode of the switching transistor Q2, the other terminal of the conductive shielding layer group 920, one terminal of the fourth resistor element R8, and the control module 400, respectively, and the other terminal of the fourth resistor element R8 is electrically connected to the other phase of the power supply bus bar group 910.

It should be noted that the first resistor element R5 has a larger resistance; one terminal of the first resistor element R5 is connected to the first bus bar 710, and the other terminal of the fourth resistor element R8 is connected to the second bus bar 720; in a normal state, there is no breakage on the conductive shielding layer group 920; the third resistor element R7 has one terminal connected to one terminal of the conductive shielding layer group 920 and the other terminal electrically connected to the other terminal of the conductive shielding layer group 920; electric potentials at two terminals of the third resistor element R7 are basically the same; the switching transistor Q2 remains in a turn-off state; when either the first shielding layer 730 or the second shielding layer 740 is broken, a voltage difference is formed at the two terminals of the third resistor element R7, a voltage of the controlled electrode of the switching transistor Q2 is pulled up, the switching transistor Q2 is turned on, and a terminal voltage at one terminal of the fourth resistor element R& is pulled up, to trigger the formation of the breakage signal; and the control module 400 controls the switch module 300 to be turned off after receiving the breakage signal, thereby ensuring the power transmission safety of the power supply bus bar group 910.

Specifically, according to some embodiments of the present invention, the resistor elements can be shared by the first resistive voltage division assembly 100 and the second resistive voltage division assembly 200. For example, as shown in FIG. 2, the shielding layer detection circuit includes a first resistor element R5, a second resistor element R6, a third resistor element R7, a fourth resistor element R8, and a switching transistor Q2, where the first resistor element R5 and the fourth resistor element R8 constitute at least a part of the first resistive voltage division assembly 100, the first resistor element R5, the second resistor element R6, the third resistor element R7, the fourth resistor element R8, and the switching transistor Q2 constitute at least a part of the second resistive voltage division assembly 200, the first resistor element R5 has one terminal electrically connected to an input electrode of the switching transistor Q2 and one phase of the power supply bus bar group 910, respectively, and the other terminal electrically connected to one terminal of the second resistor element R6, one terminal of the third resistor element R7, and one terminal of the conductive shielding layer group 920, respectively, the other terminal of the second resistor element R6 is electrically connected to a controlled electrode of the switching transistor Q2, the other terminal of the third resistor element R7 is electrically connected to an output electrode of the switching transistor Q2, the other terminal of the conductive shielding layer group 920, one terminal of the fourth resistor element R8, and the control module 400, respectively, and the other terminal of the fourth resistor element R8 is electrically connected to the other phase of the power supply bus bar group 910.

In a normal state, there is no short circuit between the first bus bar 710 and the first shielding layer 730 or between the second bus bar 720 and the second shielding layer 740; a terminal voltage of a connection point between the third resistor element R7 and the fourth resistor element R8 is low enough to trigger the formation of the electric leakage signal; when the short circuit occurs between the first bus bar 710 and the first shielding layer 730 or between the second bus bar 720 and the second shielding layer 740, a voltage of the conductive shielding layer group 920 increases to pull up the terminal voltage of the connection point between the third resistor R7 and the fourth resistor R8, to trigger the formation of the electric leakage signal; and the control module 400 controls the switch module 300 to be turned off after receiving the electric leakage signal.

Similarly, in a normal state, there is no breakage on the conductive shielding layer group 920; the third resistor element R7 has one terminal connected to one terminal of the conductive shielding layer group 920 and the other terminal electrically connected to the other terminal of the conductive shielding layer group 920; electric potentials at two terminals of the third resistor element R7 are basically the same; the switching transistor Q2 remains in a turn-off state; when either the first shielding layer 730 or the second shielding layer 740 is broken, a voltage difference is formed at the two terminals of the third resistor element R7, a voltage of the controlled electrode of the switching transistor Q2 is pulled up, the switching transistor Q2 is turned on, and a terminal voltage at one terminal of the fourth resistor element R8 is pulled up, to trigger the formation of the breakage signal; and the control module 400 controls the switch module 300 to be turned off after receiving the breakage signal, thereby ensuring the power transmission safety of the power supply bus bar group 910. Specifically, the switching transistor Q2 may be a triode, a metal oxide semiconductor (MOS) transistor, or a silicon controlled rectifier.

In some embodiments of the present invention, the shielding layer detection circuit further includes a unidirectional conductive element 610, where the unidirectional conductive element 610 has a conductive terminal electrically connected to the other terminal of the fourth resistor element R8 and a cut-off terminal electrically connected to the other phase of the power supply bus bar group 910, and the unidirectional conductive element 610 allows a current to flow from the conductive terminal to the cut-off terminal so as to prevent the current from flowing from the cut-off terminal to the conductive terminal. Specifically, the unidirectional conductive element 610 may be a diode DI or a unidirectional current limiting chip.

It should be noted that the first bus bar 710 and the second bus bar 720 transmit the alternating current. For example, the first bus bar 710 may be connected to a live wire, and the second bus bar 720 may be connected to a neutral wire, or the first bus bar 710 may be connected to one phase of a three-phase power supply, and the second bus bar 720 may be connected to another phase of the three-phase power supply. The unidirectional conductive element 610 can allow a current of the second bus bar 720 to flow back from the fourth resistor element R8, which makes the shielding layer detection circuit operate reasonably and orderly, so that the detection is more stable and accurate.

In some embodiments of the present invention, the shielding layer detection circuit further includes a test switch 620, where the test switch 620 is connected in parallel to the first resistor element R5 and is driven to switch an on/off state. Specifically, the test switch 620 may be a press switch, a magnetic switch, a self-reset normally open switch, a self-locking switch, etc.

When a user needs to turn off the switch module 300 timely, the test switch 620 may be closed to be turned on. In this case, the first resistor element R5 is short-circuited, the terminal voltage of the third resistor element R7 is pulled up, and the switching transistor Q2 is turned on, so as to trigger the control module 400 to control the switch module 300 to be turned off.

In some embodiments of the present invention, as shown in FIG. 2, the switch module 300 includes a relay unit, the relay unit includes a relay switch 310 and a relay coil 320 capable of driving the relay switch 310 to be turned on/off, the relay switch 310 is connected to the power supply bus bar group 910 to switch the transmission line connection/disconnection state of the power supply bus bar group 910, the control module 400 includes a switching transistor Q1, the relay coil 320 is connected to the switching transistor Q1 to constitute at least a part of a driving power supply circuit, the driving power supply circuit is connected to the power supply bus bar group 910, and a controlled electrode of the switching transistor Q1 is connected to the output terminal of the first resistive voltage division assembly 100 and the output terminal of the second resistive voltage division assembly 200, respectively.

There may be two relay switches 310 connected to the first bus bar 710 and the second bus bar 720 in a one-to-one correspondence manner. The relay switch 310 may be in a normally closed state. When any one of an electric leakage signal, a breakage signal, and an overvoltage signal occurs, the control module 400 may control the relay coil 320 to be energized, and the relay coil 320 may drive the relay switch 310 to be turned off.

The switching transistor Q1 may be a triode, an MOS transistor, or a silicon controlled rectifier. Specifically, the driving power supply circuit has one terminal connected to the first bus bar 710 and the other terminal connected to the second bus bar 720. The controlled electrode of the switching transistor Q1 is energized to turn on the switching transistor Q1, the driving power supply circuit is turned on, and the relay coil 320 is energized to drive the relay switch 310 to be turned off.

In some embodiments of the present invention, the shielding layer detection circuit further includes an indicator light group 500 electrically connected to the power supply bus bar group 910. The indicator light group 500 may include LED beads LED1.

Specifically, the indicator light group 500 may be connected in parallel to the switching transistor Q1. When the transmission line transmits the electrical energy normally, the switching transistor Q1 is in a turn-off state, and the indicator light group 500 is turned on. When the transmission line leaks electricity or the conductive shielding layer group 920 is broken, the switching transistor Q1 is closed to be turned on, and the indicator light group 500 is short-circuited to be turned off. Therefore, the user can know a power transmission status of the transmission line according to an on/off state of the indicator light group 500.

As shown in FIGS. 1-4, a transmission system according to an embodiment of a second aspect of the present invention includes a shielding layer detection circuit and a power supply bus bar group 910. The power supply bus bar group 910 is sheathed with a conductive shielding layer group 920. The shielding layer detection circuit includes a first resistive voltage division assembly 100, a second resistive voltage division assembly 200, a switch module 300, and a control module 400. The first resistive voltage division assembly 100 is connected to the conductive shielding layer group 920 to detect an electric leakage signal, where the electric leakage signal is used to represent that a short circuit occurs between the power supply bus bar group 910 and the conductive shielding layer group 920. The second resistive voltage division assembly 200 includes a first detection terminal and a second detection terminal, where the second resistive voltage division assembly 200 has the first detection terminal connected to one terminal of the conductive shielding layer group 920 and the second detection terminal connected to the other terminal of the conductive shielding layer group 920 to detect a breakage signal, where the breakage signal is used to represent that the conductive shielding layer group 920 is broken. The switch module 300 is connected to the power supply bus bar group 910 to switch a transmission line connection/disconnection state of the power supply bus bar group 910. The control module 400 is connected to an output terminal of the first resistive voltage division assembly 100, an output terminal of the second resistive voltage division assembly 200, and a controlled terminal of the switch module 300, respectively, to control the switch module 300 to be turned off when receiving either of the electric leakage signal and the breakage signal.

According to the transmission system in the present invention, electrical energy is transmitted by using the power supply bus bar group 910; the conductive shielding layer group 920 is configured to detect a power transmission safety state of the power supply bus bar group 910; when the conductive shielding layer group 920 is broken, voltage division processing is performed by using the second resistive voltage division assembly 200 to detect and form the breakage signal, and when the power supply bus bar group 910 has a fault, the short circuit occurs between the power supply bus bar group 910 and the conductive shielding layer group 920, and voltage division processing is performed by using the first resistive voltage division assembly 100 to detect and form the electric leakage signal; and the control module 400 controls the switch module 300 to be turned off when receiving either of the electric leakage signal and the breakage signal. Resistor elements have better durability of use and are not prone to aging and damage, so that good detection accuracy can be always maintained; and frequent maintenance is not required in a short term, thereby reducing the maintenance cost.

In some embodiments of the present invention, the power supply bus bar group 910 includes a first bus bar 710 and a second bus bar 720, the conductive shielding layer group 920 includes a first shielding layer 730 and a second shielding layer 740 that are conductive, the first shielding layer 730 is sheathed on the first bus bar 710, the second shielding layer 740 is sheathed on the second bus bar 720, the switch module 300 is connected to the first bus bar 710 and the second bus bar 720, respectively, to switch transmission line connection/disconnection states of the first bus bar 710 and the second bus bar 720, the first resistive voltage division assembly 100 is connected to the first shielding layer 730 or the second shielding layer 740, the second resistive voltage division assembly 200 has the first detection terminal connected to one terminal of the first shielding layer 730 and the second detection terminal connected to one terminal of the second shielding layer 740, and the other terminal of the first shielding layer 730 is connected to the other terminal of the second shielding layer 740.

The first bus bar 710 includes a first current carrying core 711 and a first insulation layer 712 that wraps a peripheral surface of the first current carrying core 711. The first shielding layer 730 wraps a peripheral surface of the first insulation layer 712. The second bus bar 720 includes a second current carrying core 721 and a second insulation layer 722 that wraps a peripheral surface of the second current carrying core 721. The second shielding layer 740 wraps a peripheral surface of the second insulation layer 722. The first shielding layer 730 is conductively connected to the second shielding layer 740.

The first current carrying core 711 may be connected to an L phase of an alternating current power supply, and the second current carrying core 721 may be connected to an N phase of the alternating current power supply. The first shielding layer 730 can play a shielding role in power transmission of the first current carrying core 711, and the second shielding layer 740 can play a shielding role in power transmission of the second current carrying core 721. Meanwhile, when the first current carrying core 711 leaks electricity to outside during power transmission, a current breaks through the first insulation layer 712 and then is transmitted to the shielding detection circuit through the first shielding layer 730. Similarly, when the second current carrying core 721 leaks electricity to outside during power transmission, a current breaks through the second insulation layer 722 and then is transmitted to the shielding detection circuit through the second shielding layer 740.

Both the first current carrying core 711 and the second current carrying core 721 may be formed by twisting conductive wires made of metals such as copper and aluminum or alloys.

In some embodiments of the present invention, both the first insulation layer 712 and the second insulation layer 722 may be made from plastics, rubber, or irradiated ethylene-propylene materials. Specifically, the plastics may be polyvinyl chloride (PVC) materials, the rubber may be chlorinated polyethylene (CPE) synthetic rubber materials, and the irradiated ethylene-propylene materials may be ethylene-propylene-diene monomer rubber, where the irradiated ethylene-propylene materials have the better insulation and waterproof properties compared with conventional irradiated chlorinated polyethylene insulation materials.

It should be noted that the transmission line further includes a sheath layer 750, the sheath layer 750 wraps the first bus bar 710 and the second bus bar 720 therein, and fillers may also be arranged between the first bus bar 710 and the second bus bar 720 and between an interior of the sheath layer 750 and an outer wall of the first bus bar 710 or an outer wall of the second bus bar 720. Specifically, the fillers may be aramid fibers.

Figure 4:
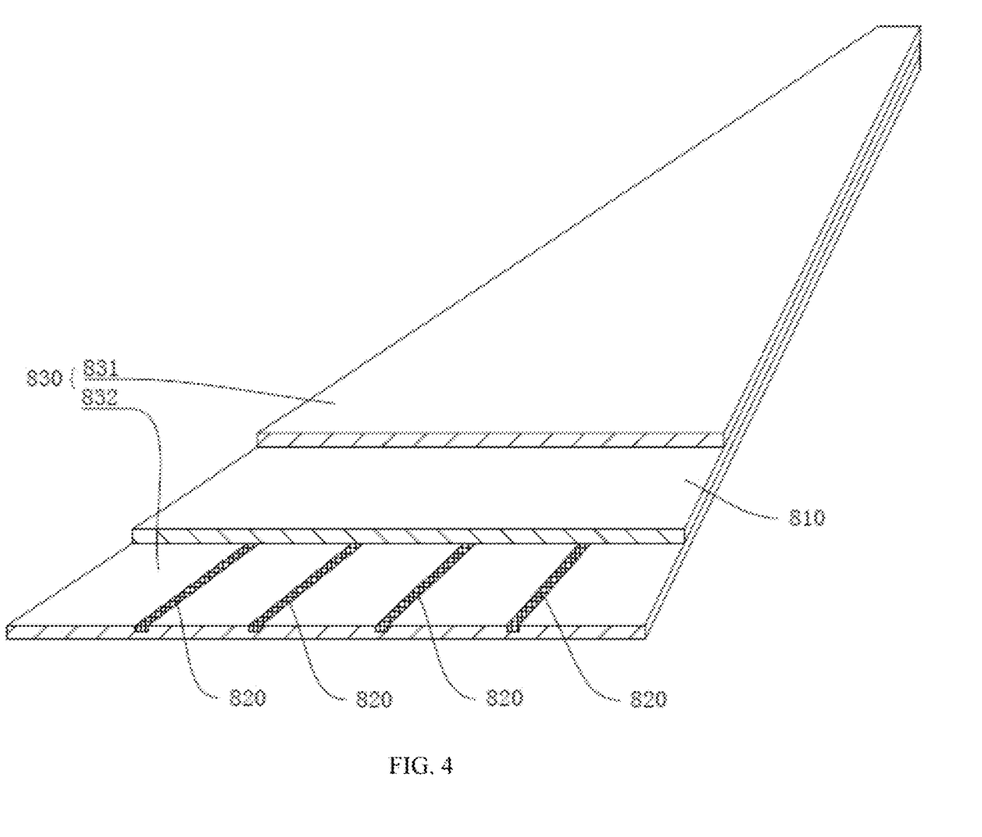
FIG. 4 is a schematic structural diagram of a first shielding layer.

Both the first shielding layer 730 and the second shielding layer 740 may be made from composite conductive materials. Specifically, as shown in FIG. 4, the composite conductive material includes a non-woven fabric layer 810, at least a wire body 820, and a non-metallic conductive layer assembly 830. The wire body 820 is arranged on at least a surface of the non-woven fabric layer 810 and extends along a length direction of the non-woven fabric layer 810. The conductive layer assembly 830 covers at least a surface of the non-woven fabric layer 810, and the wire body 820 is located between the conductive layer assembly 830 and the non-woven fabric layer 810. The wire body 820 is electrically connected to the conductive layer assembly 830.

The non-woven fabric layer 810 is produced from polyester fiber (PET for short) materials through a needle punching technology, and has the better flexibility.

The wire body 820 may be a copper wire or an aluminum alloy wire. There may be a plurality of wire bodies 820. Specifically, the non-woven fabric layer 810 is generally cut to be in a strip shape, the wire body 820 extends along the length direction of the non-woven fabric layer 810, while the plurality of wire bodies 820 may be spaced along a width direction of the non-woven fabric layer 810, and a control line connected to the shielding detection circuit is easily connected to an end of the wire body 820.

In some embodiments of the present invention, the conductive layer assembly 830 is made of one of superconducting graphene, superconducting carbon nanomaterials, superconducting graphite, and superconducting carbon black.

The superconducting graphene, the superconducting carbon nanomaterials, the superconducting graphite, and the superconducting carbon black are non-metallic superconducting materials with better conductivity. The conductive layer assembly 830 covers the wire body 820 and consequently is in close contact with the wire body 820 to conduct electricity. Specifically, during production, the superconducting graphene, the superconducting carbon nanomaterials, the superconducting graphite, and the superconducting carbon black are generally liquid pastes, which are soaked or coated on the surface of the non-woven fabric layer 810 and then are solidified. The solidified pastes of the superconducting graphene, the superconducting carbon nanomaterials, the superconducting graphite, and the superconducting carbon black have certain flexibility, so that the conductive layer assembly 830 is not prone to breakage when bent under the support of a non-woven fabric.

The non-woven fabric layer 810 has good toughness, and the non-metallic conductive layer assembly 830 covers the non-woven fabric layer 810. When the composite conductive material is bent, the non-woven fabric layer 810 is not easily torn, and can provide good support for the conductive layer assembly 830, so that the conductive layer assembly 830 maintains good conductivity. The wire body 820 can also be in close contact with the conductive layer assembly 830, so that an electrical signal induced by the conductive layer assembly 830 can be transmitted to the outside through the wire body 820.

In some embodiments of the present invention, the conductive layer assembly 830 includes a first conductive layer 831 and a second conductive layer 832. The first conductive layer 831 covers an upper surface of the non-woven fabric layer 810, the second conductive layer 832 covers a lower surface of the non-woven fabric layer 810, and the wire body 820 is located between the second conductive layer 832 and the non-woven fabric layer 810 and is conductively connected to the second conductive layer 832.

In general, the wire body 820 is arranged on one surface of the non-woven fabric layer 810, and the first conductive layer 831 covers the upper surface of the non-woven fabric layer 810, while the second conductive layer 832 covers the lower surface of the non-woven fabric layer 810, which can improve the overall strength of the composite conductive material. Meanwhile, the composite conductive material may be used to form a shielding layer of a power line, so that the shielding capability of the shielding layer to electromagnetic interference signals and the accuracy of electric leakage detection can be improved.

The technical features of the above embodiments may be combined arbitrarily. For the sake of brevity, all possible combinations of the technical features in the above embodiments are not described. However, the combinations of these technical features should be considered to be within the scope of this specification as long as there is no contradiction between them.

Although the embodiments of the present invention have been shown and described, it may be understood by those of ordinary skill in the art that various changes, modifications, substitutions, and variations may be made to these embodiments without departing from the principle and objective of the present invention. The scope of the present invention is defined by the claims and their equivalents.

What is claimed is:

1. A shielding layer detection circuit, applied to a power supply bus bar group, the power supply bus bar group being sheathed with a conductive shielding layer group, wherein the shielding layer detection circuit comprises:
   a first resistive voltage division assembly, connected to the conductive shielding layer group to detect an electric leakage signal, wherein the electric leakage signal is used to represent that a short circuit occurs between the power supply bus bar group and the conductive shielding layer group;
   a second resistive voltage division assembly, comprising a first detection terminal and a second detection terminal, wherein the second resistive voltage division assembly has the first detection terminal connected to one terminal of the conductive shielding layer group and the second detection terminal connected to the other terminal of the conductive shielding layer group to detect a breakage signal, wherein the breakage signal is used to represent that the conductive shielding layer group is broken;
   a switch module, connected to the power supply bus bar group to switch a transmission line connection/disconnection state of the power supply bus bar group; and
   a control module, connected to an output terminal of the first resistive voltage division assembly, an output terminal of the second resistive voltage division assembly, and a controlled terminal of the switch module, respectively, to control the switch module to be turned off when receiving either of the electric leakage signal and the breakage signal.

2. The shielding layer detection circuit according to claim 1, comprising a first resistor element R5, a second resistor element R6, a third resistor element R7, a fourth resistor element R8, and a switching transistor Q2, wherein the first resistor element R5 and the fourth resistor element R5 constitute at least a part of the first resistive voltage division assembly, the first resistor element R5, the second resistor element R6, the third resistor element R7, the fourth resistor element R8, and the switching transistor Q2 constitute at least a part of the second resistive voltage division assembly, the first resistor element R5 has one terminal electrically connected to an input electrode of the switching transistor Q2 and one phase of the power supply bus bar group, respectively, and the other terminal electrically connected to one terminal of the second resistor element R6, one terminal of the third resistor element R7, and one terminal of the conductive shielding layer group, respectively, the other terminal of the second resistor element R6 is electrically connected to a controlled electrode of the switching transistor Q2, the other terminal of the third resistor element R7 is electrically connected to an output electrode of the switching transistor Q2, the other terminal of the conductive shielding layer group, one terminal of the fourth resistor element R8, and the control module, respectively, and the other terminal of the fourth resistor element R8 is electrically connected to the other phase of the power supply bus bar group.

3. The shielding layer detection circuit according to claim 2, further comprising a unidirectional conductive element, wherein the unidirectional conductive element has a conductive terminal electrically connected to the other terminal of the fourth resistor element R8 and a cut-off terminal electrically connected to the other phase of the power supply bus bar group, and the unidirectional conductive element allows a current to flow from the conductive terminal to the cut-off terminal so as to prevent the current from flowing from the cut-off terminal to the conductive terminal.

4. The shielding layer detection circuit according to claim 2, further comprising a test switch, wherein the test switch is connected in parallel to the first resistor element R5 and is driven to switch an on/off state.

5. The shielding layer detection circuit according to claim 1, wherein the first resistive voltage division assembly comprises a first resistor element R5 and a fourth resistor element R8, the first resistor element R5 has one terminal electrically connected to one phase of the power supply bus bar group and the other terminal electrically connected to one terminal of the fourth resistor element R8, the control module, and the conductive shielding layer group, and the other terminal of the fourth resistor element R8 is electrically connected to the other phase of the power supply bus bar group.

6. The shielding layer detection circuit according to claim 1, wherein the second resistive voltage division assembly comprises a first resistor element R5, a second resistor element R6, a third resistor element R7, a fourth resistor element R8, and a switching transistor Q2, the first resistor element R5 has one terminal electrically connected to an input electrode of the switching transistor Q2 and one phase of the power supply bus bar group, respectively, and the other terminal electrically connected to one terminal of the second resistor element R6, one terminal of the third resistor element R7, and one terminal of the conductive shielding layer group, respectively, the other terminal of the second resistor element R6 is electrically connected to a controlled electrode of the switching transistor Q2, the other terminal of the third resistor element R7 is electrically connected to an output electrode of the switching transistor Q2, the other terminal of the conductive shielding layer group, one terminal of the fourth resistor element R8, and the control module, respectively, and the other terminal of the fourth resistor element R8 is electrically connected to the other phase of the power supply bus bar group.

7. The shielding layer detection circuit according to claim 1, wherein the switch module comprises a relay unit, the relay unit comprises a relay switch and a relay coil capable of driving the relay switch to be turned on/off, the relay switch is connected to the power supply bus bar group to switch the transmission line connection/disconnection state of the power supply bus bar group, the control module comprises a switching transistor Q1, the relay coil is connected to the switching transistor Q1 to constitute at least a part of a driving power supply circuit, the driving power supply circuit is connected to the power supply bus bar group, and a controlled electrode of the switching transistor Q1 is connected to the output terminal of the first resistive voltage division assembly and the output terminal of the second resistive voltage division assembly, respectively.

8. The shielding layer detection circuit according to claim 1, further comprising an indicator light group electrically connected to the power supply bus bar group.

9. A transmission system, comprising a shielding layer detection circuit and a power supply bus bar group, wherein the power supply bus bar group is sheathed with a conductive shielding layer group; and
the shielding layer detection circuit comprises:
a first resistive voltage division assembly, connected to the conductive shielding layer group to detect an electric leakage signal, wherein the electric leakage signal is used to represent that a short circuit occurs between the power supply bus bar group and the conductive shielding layer group;
a second resistive voltage division assembly, comprising a first detection terminal and a second detection terminal, wherein the second resistive voltage division assembly has the first detection terminal connected to one terminal of the conductive shielding layer group and the second detection terminal connected to the other terminal of the conductive shielding layer group to detect a breakage signal, wherein the breakage signal is used to represent that the conductive shielding layer group is broken;
a switch module, connected to the power supply bus bar group to switch a transmission line connection/disconnection state of the power supply bus bar group; and
a control module, connected to an output terminal of the first resistive voltage division assembly, an output terminal of the second resistive voltage division assembly, and a controlled terminal of the switch module, respectively, to control the switch module to be turned off when receiving either of the electric leakage signal and the breakage signal.

10. The transmission system according to claim 9, wherein the power supply bus bar group comprises a first bus bar and a second bus bar, the conductive shielding layer group comprises a first shielding layer and a second shielding layer that are conductive, the first shielding layer is sheathed on the first bus bar, the second shielding layer is sheathed on the second bus bar, the switch module is connected to the first bus bar and the second bus bar, respectively, to switch transmission line connection/disconnection states of the first bus bar and the second bus bar, the first resistive voltage division assembly is connected to the first shielding layer or the second shielding layer, the second resistive voltage division assembly has the first detection terminal connected to one terminal of the first shielding layer and the second detection terminal connected to one terminal of the second shielding layer, and the other terminal of the first shielding layer is connected to the other terminal of the second shielding layer.

* * * * *